US012550351B2

(12) United States Patent
Li et al.

(10) Patent No.: US 12,550,351 B2
(45) Date of Patent: Feb. 10, 2026

(54) DIFFUSION BREAK BETWEEN PASSIVE DEVICE AND LOGIC DEVICE WITH BACKSIDE CONTACT

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Kisik Choi, Watervliet, NY (US); John Christopher Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 18/361,947

(22) Filed: Jul. 31, 2023

(65) Prior Publication Data

US 2025/0046714 A1    Feb. 6, 2025

(51) Int. Cl.
*H10D 30/01*    (2025.01)
*H01L 21/762*    (2006.01)
(Continued)

(52) U.S. Cl.
CPC ... *H10D 30/0198* (2025.01); *H01L 21/76224* (2013.01); *H01L 23/5286* (2013.01);
(Continued)

(58) Field of Classification Search
CPC ............... H10D 87/00; H10D 84/0151; H10D 30/019–0198; H10D 84/0198;
(Continued)

(56) References Cited

U.S. PATENT DOCUMENTS 9,331,062 B1    5/2016    Lane
10,439,026 B2    10/2019    Wong
(Continued)

FOREIGN PATENT DOCUMENTS

WO    2019035945 A1    2/2019

OTHER PUBLICATIONS

Monta et al., "3-D CMOS Chip Stacking for Security ICs Featuring Backside Buried Metal Power Delivery Networks With Distributed Capacitance", IEEE Transactions on Electron Devices, Manuscript received Nov. 17, 2020; revised Dec. 27, 2020; accepted Jan. 31, 2021, pp. 1-6.

*Primary Examiner* — Earl N Taylor
(74) *Attorney, Agent, or Firm* — Yuanmin Cai

(57) ABSTRACT

Embodiments of present invention provide a method of forming a semiconductor structure. The method includes forming a passive device area and a logic device area on a substrate; forming a diffusion break between the passive device area and the logic device area, wherein the diffusion break extends into the substrate; removing a portion of the substrate to expose a bottom portion of the diffusion break; covering a first portion of the substrate underneath the passive device area and the bottom portion of the diffusion break with a hard mask; selectively removing a second portion of the substrate to expose at least a portion of a bottom surface of the logic device area; and depositing a backside interlevel dielectric (BILD) layer to cover the portion of the bottom surface of the logic device area. The semiconductor structure formed thereby is also provided.

20 Claims, 17 Drawing Sheets

(51) Int. Cl.
*H01L 23/528* (2006.01)
*H10D 62/10* (2025.01)
*H10D 64/01* (2025.01)
*H10D 84/01* (2025.01)
*H10D 84/83* (2025.01)

(52) U.S. Cl.
CPC ......... *H10D 62/121* (2025.01); *H10D 64/017* (2025.01); *H10D 84/0151* (2025.01); *H10D 84/832* (2025.01)

(58) Field of Classification Search
CPC .... H10D 84/832; H10D 30/01; H10D 30/014; H10D 30/024; H10D 30/031; H10D 30/0321; H10D 30/0323; H10D 30/0327; H10L 21/823481
See application file for complete search history.

(56) References Cited

U.S. PATENT DOCUMENTS

| | | |
|---|---|---|
| 11,121,086 B2 | 9/2021 | Hiblot |
| 12,243,913 B2 | 3/2025 | Jain et al. |
| 2020/0020570 A1* | 1/2020 | Sung ................ H10D 62/115 |
| 2022/0157786 A1 | 5/2022 | Chuang |
| 2022/0336460 A1* | 10/2022 | Liaw ................ H10D 84/853 |
| 2022/0384415 A1 | 12/2022 | Park |
| 2022/0415880 A1 | 12/2022 | Kar |
| 2023/0154783 A1* | 5/2023 | Xie ................ H01L 21/76898 |
| | | 257/382 |
| 2023/0290779 A1* | 9/2023 | Do ................ H10D 84/0149 |
| 2024/0290834 A1* | 8/2024 | Lee ................ H10D 84/811 |
| 2024/0297167 A1* | 9/2024 | Xie ................ H10D 89/10 |
| 2024/0347423 A1* | 10/2024 | Mukesh ............ H10D 84/0149 |
| 2025/0022913 A1* | 1/2025 | Li ................ H10D 84/83 |

* cited by examiner

DIFFUSION BREAK BETWEEN PASSIVE DEVICE AND LOGIC DEVICE WITH BACKSIDE CONTACT

BACKGROUND

The present application relates to manufacturing of semiconductor integrated circuits. More particularly, it relates to diffusion break between passive device and logic device with backside contact and backside power distribution network and method of forming the same.

As semiconductor industry moves towards smaller node, for example 7-nm node and beyond, field-effect-transistors (FETs) are aggressively scaled in order to fit into the reduced footprint or real estate, which is often dictated by the node size, with increased device density. Recently, backside power distribution network (BSPDN) is introduced as a mean to further enhance the device density. Together, backside contacts are used to access devices through the backside of the semiconductor chip.

With the introduction of BSPDN and backside contacts for, for example, logic devices such as transistors, there is a need to co-integrate current passive devices with the logic devices with backside contacts and BSPDN. While passive devices are generally formed on top of a substrate, the logic devices with backside contacts and BSPDN generally require the complete removal of the substrate upon which they are initially formed. Therefore, it remains a challenge to form a passive device area adjacent to a logic device area while they have different requirement for the substrate.

SUMMARY

Embodiments of present invention provide a semiconductor structure. The structure includes a passive device area adjacent to a logic device area; a diffusion break between the passive device area and the logic device area, where the diffusion break extends below the passive device area and the logic device area to separate a doped silicon substrate underneath the passive device area from a backside interlevel dielectric (BILD) layer underneath the logic device area.

According to one embodiment, the structure further includes a hard mask covering a bottom surface of the doped silicon substrate, where the diffusion break extends into the hard mask to be in contact with the hard mask.

According to another embodiment, the structure further includes a backside power rail (BSPR) directly underneath the doped silicon substrate below the passive device area and the BILD layer below the logic device area, where the hard mask separates vertically the doped silicon substrate from the BSPR.

In one embodiment, a source/drain region of a transistor in the logic device area is connected to the BSPR through a backside contact formed in the BILD layer.

In another embodiment, the diffusion break is a single diffusion break formed through a gate region of a dummy gate.

In yet another embodiment, a first sidewall of a lower portion of the diffusion break is in direct contact with the doped silicon substrate and a second sidewall of the lower portion of the diffusion break is in direct contact with the BILD layer.

In a further embodiment, the passive device area and the logic device area are further separated by a dielectric layer, the dielectric layer being formed directly on top of the BILD layer.

Embodiments of present invention also provide a method of forming a semiconductor structure. The method includes forming a passive device area and a logic device area on a substrate; forming a diffusion break between the passive device area and the logic device area, wherein the diffusion break extends into the substrate; removing a portion of the substrate to expose a bottom portion of the diffusion break; covering a first portion of the substrate underneath the passive device area and the bottom portion of the diffusion break with a hard mask; selectively removing a second portion of the substrate to expose at least a portion of a bottom surface of the logic device area; and depositing a backside interlevel dielectric (BILD) layer to cover the portion of the bottom surface of the logic device area.

In one embodiment, forming the diffusion break includes forming a set of sacrificial gate structures on top of the substrate; removing a sacrificial gate of one of the sacrificial gate structures and a set of nanosheets covered by the sacrificial gate to create a first opening, the first opening exposes a portion of the substrate; creating a second opening in the substrate that extends from the first opening; and filling the first and the second opening with a dielectric material to form the diffusion break.

In another embodiment, creating the second opening includes etching the exposed portion of the substrate until an etch-stop layer in the substrate is exposed.

According to one embodiment, the method further includes forming a backside contact in the BILD layer by creating an opening in the BILD layer to expose a placeholder and replacing the placeholder with a conductive material to form the backside contact, the backside contact being in contact with a source/drain region of a transistor in the logic device area.

According to another embodiment, the method further includes forming a backside power rail (BSPR) in contact with the backside contact in the BILD layer, wherein the hard mask separates the first portion of the substrate underneath the passive device area from the BSPR.

According to yet another embodiment, the method further includes, after forming the diffusion break, conducing a replacement metal gate (RMG) process to form a set of metal gate replacing the set of sacrificial gate structures.

BRIEF DESCRIPTION OF THE DRAWINGS

The present invention will be understood and appreciated more fully from the following detailed description of embodiments of present invention, taken in conjunction with accompanying drawings of which.

Figure 1:
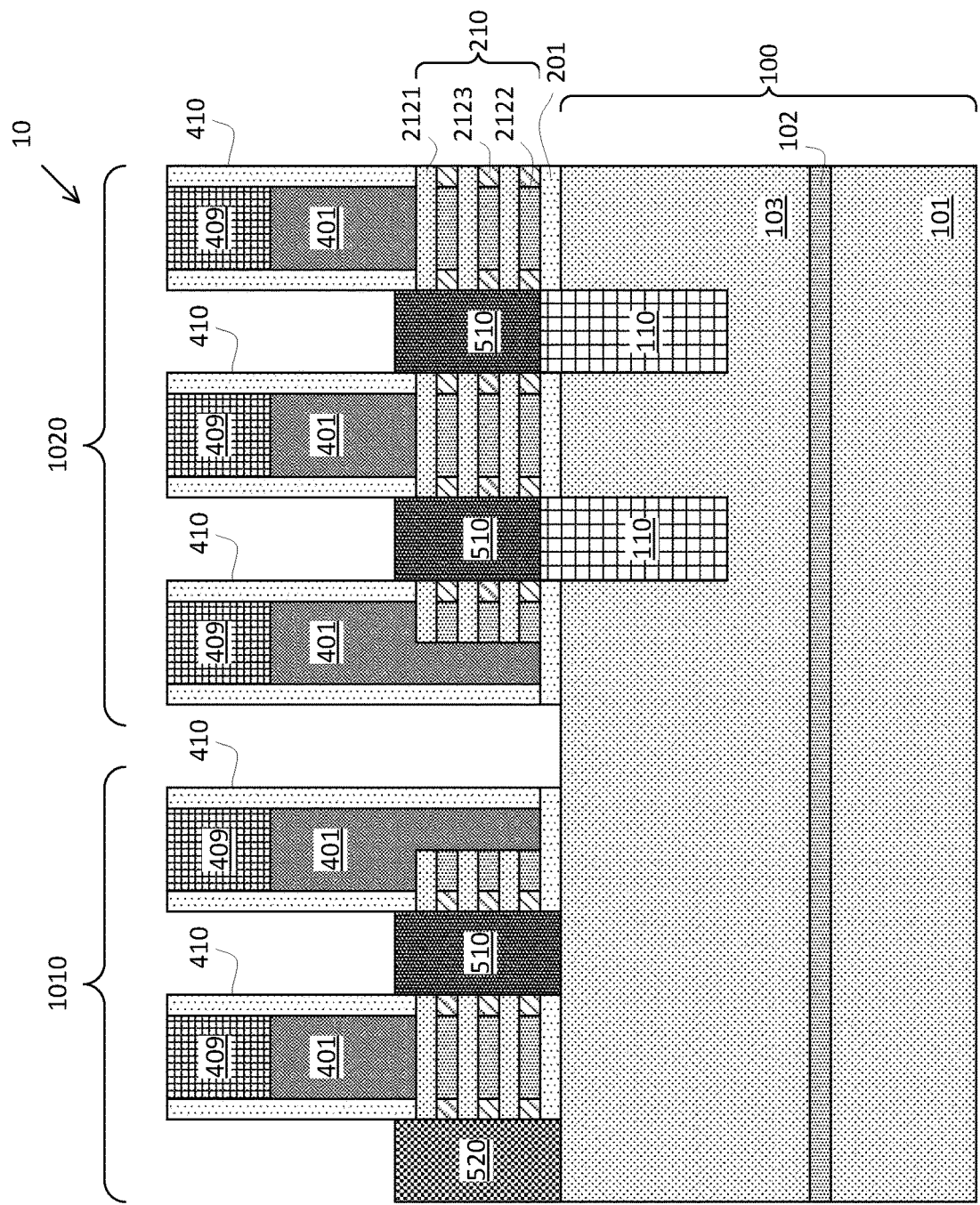
FIGS. 1-16 are demonstrative illustrations of cross-sectional view of a semiconductor structure during a process of manufacturing thereof according to various embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure during a process of manufacturing thereof according to one embodiment of present invention. More particularly, embodiments of present invention provide forming a semiconductor structure 10 that includes a passive device area 1010 and an active device area such as, for example, a logic device area 1020. In forming the passive device area 1010 and logic device area 1020, embodiments of present invention provide receiving or providing a semiconductor substrate 100; forming one or more stacks of nanosheets 210 on top of the substrate 100; and forming one or more sets of sacrificial gate structures covering the one or more stacks of nanosheets 210. Here, for the purpose of illustration and description, forming nanosheet transistors and passive devices based on nanosheets are used as a non-limiting example. Embodiments of present invention may be equally applied to forming other types of active and passive device such as fin-type transistors and/or vertical transistors.

The semiconductor substrate 100 may include a bulk silicon substrate 101, an etch-stop layer 102 on top of the bulk silicon substrate 101, and a silicon layer 103 on top of the etch-stop layer 102. The etch-stop layer 102 may be a layer of silicon-germanium (SiGe), an insulating layer of dielectric material such as $SiO_2$, and/or other types of material that may possess an etch selectivity different from those of the silicon substrate 101 and the silicon layer 103. The silicon layer 103 may be doped with ions to form, for example, N-well in a region underneath the passive device area 1010 and may be referred to as doped silicon layer as well.

The one or more stacks of nanosheets 210 may be formed, for example, from a stack of raw nanosheets through recessing a portion thereof and may be formed on top of a dielectric layer 201. In one embodiment, the dielectric layer 201 may insulate the one or more stacks of nanosheets 210 from the doped silicon layer 103 underneath thereof. The one or more sets of sacrificial gate structures may include a set of sacrificial gates 401 with a set of hard masks 409 on top thereof. Sidewall spacers 410 may be formed at sidewalls of the sacrificial gates 401 as well as the hard masks 409. In one embodiment, the set of sacrificial gates 401 may be formed in a fixed pitch across from the passive device area 1010 to the logic device area 1020.

Embodiments of present invention may further provide forming one or more placeholders 110 in the logic device area 1020 of the silicon layer 103 for forming backside contacts in a later processing step through a backside of the substrate 100. The placeholders 110 may be, for example, silicon-carbide (SIC) or (100) epitaxially grown SiGe and thus may be materially different from that of the silicon layer 103. The one or more stacks of nanosheets 210 may be formed to include a set of nanosheets 2121 separated by a set of sacrificial sheets 2122. Indentations may be formed at the set of sacrificial sheets 2122 and inner spacers 2123 may be formed at the indentations of the set of sacrificial sheets 2122. Epitaxial growth of SiGe, for example, may be performed at the ends of the set of nanosheets 2121 to form source/drain regions, such as source/drain regions 510 and 520 with different types of dopants.

Figure 2:
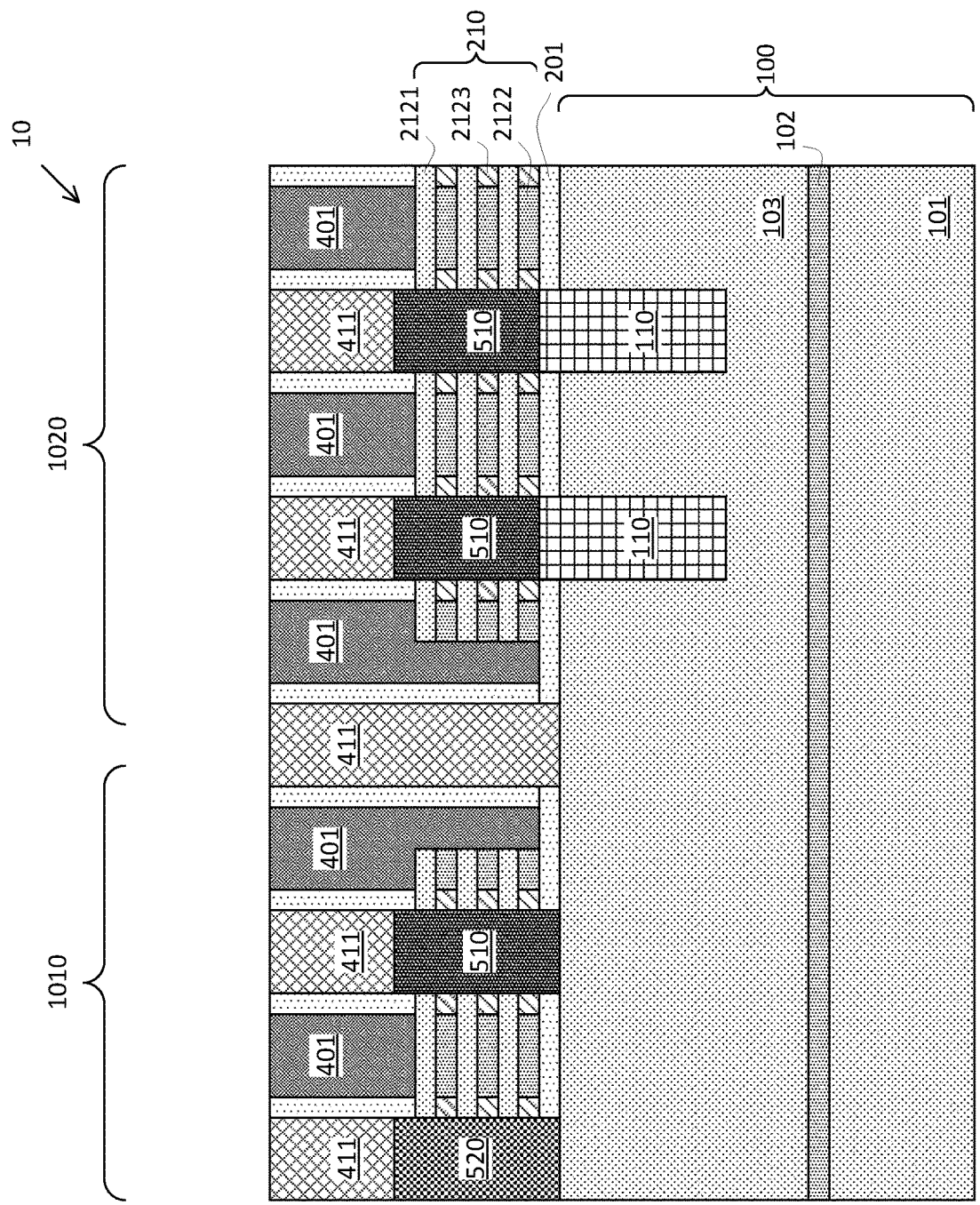

FIG. 2 is a demonstrative illustration of cross-sectional view of a semiconductor structure during a process of manufacturing thereof according to one embodiment of present invention. More particularly, following the step illustrated in FIG. 1, embodiments of present invention provide filling spaces between the one or more sets of sacrificial gate structures with a dielectric material, such as through deposition, to form a dielectric layer 411. The dielectric layer 411 may be formed in areas above the source/drain regions 510 and 520 and in-between the passive device area 1010 and the logic device area 1020. After forming the dielectric layer 411 through deposition, a chemical-mechanical-polishing (CMP) process may be applied to planarize a top surface of the structure 10 such as by removing the hard mask 409 on top of the set of sacrificial gates 401 through the CMP process.

Figure 3:
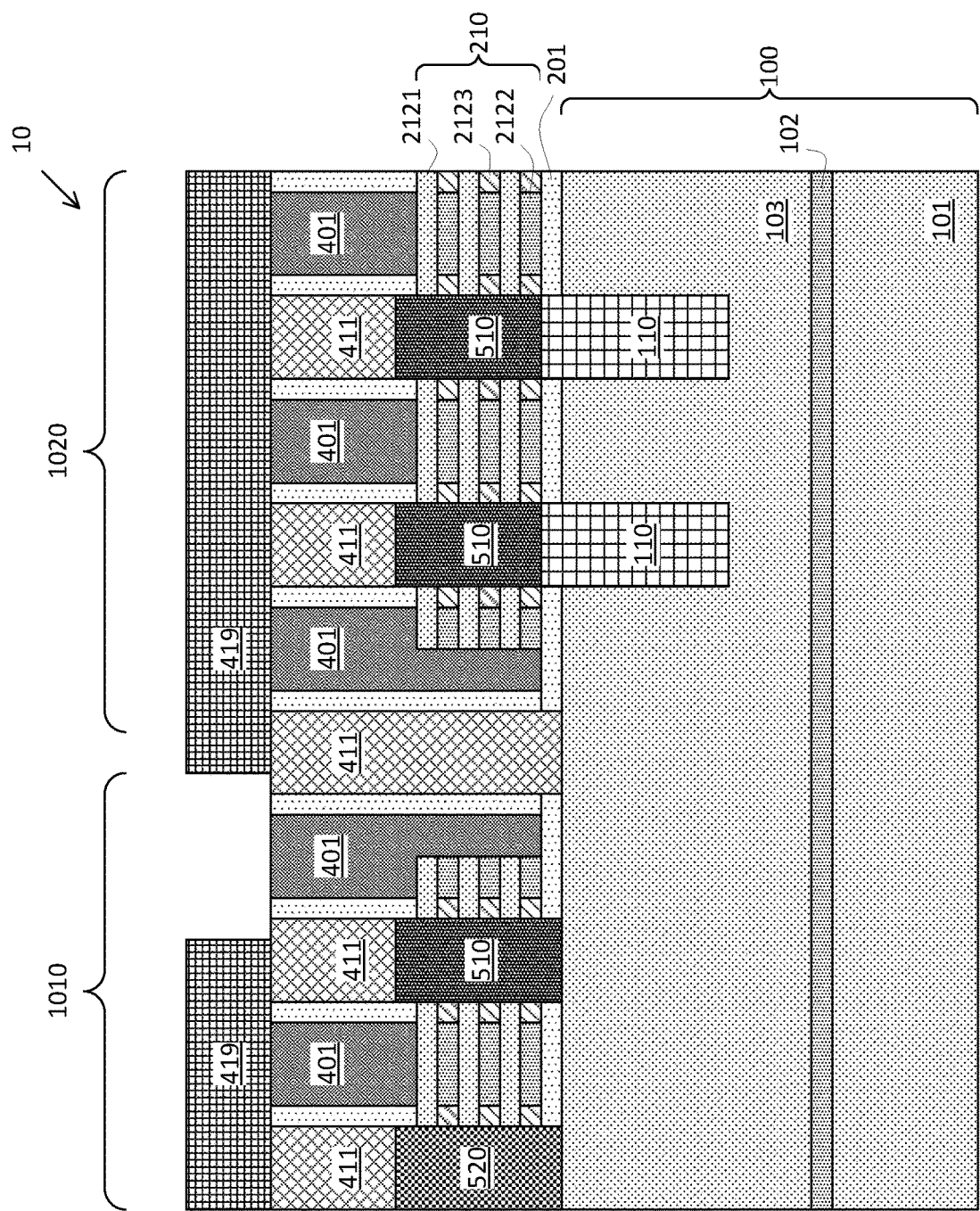

FIG. 3 is a demonstrative illustration of cross-sectional view of a semiconductor structure during a process of manufacturing thereof according to one embodiment of present invention. More particularly, following the step illustrated in FIG. 2, embodiments of present invention provide forming a diffusion break. In forming the diffusion break, an organic planarization layer (OPL) 419 may be formed on top of the structure 10 and patterned to expose one of the sacrificial gate structures. For example, one of the sacrificial gate structures at the edge between the passive device area 1010 and the logic device area 1020 may be a dummy gate structure, which as is illustrated in FIG. 3 covers only a portion of the set of nanosheets 2121, and the dummy gate structure may be used to form the diffusion break.

Figure 4:
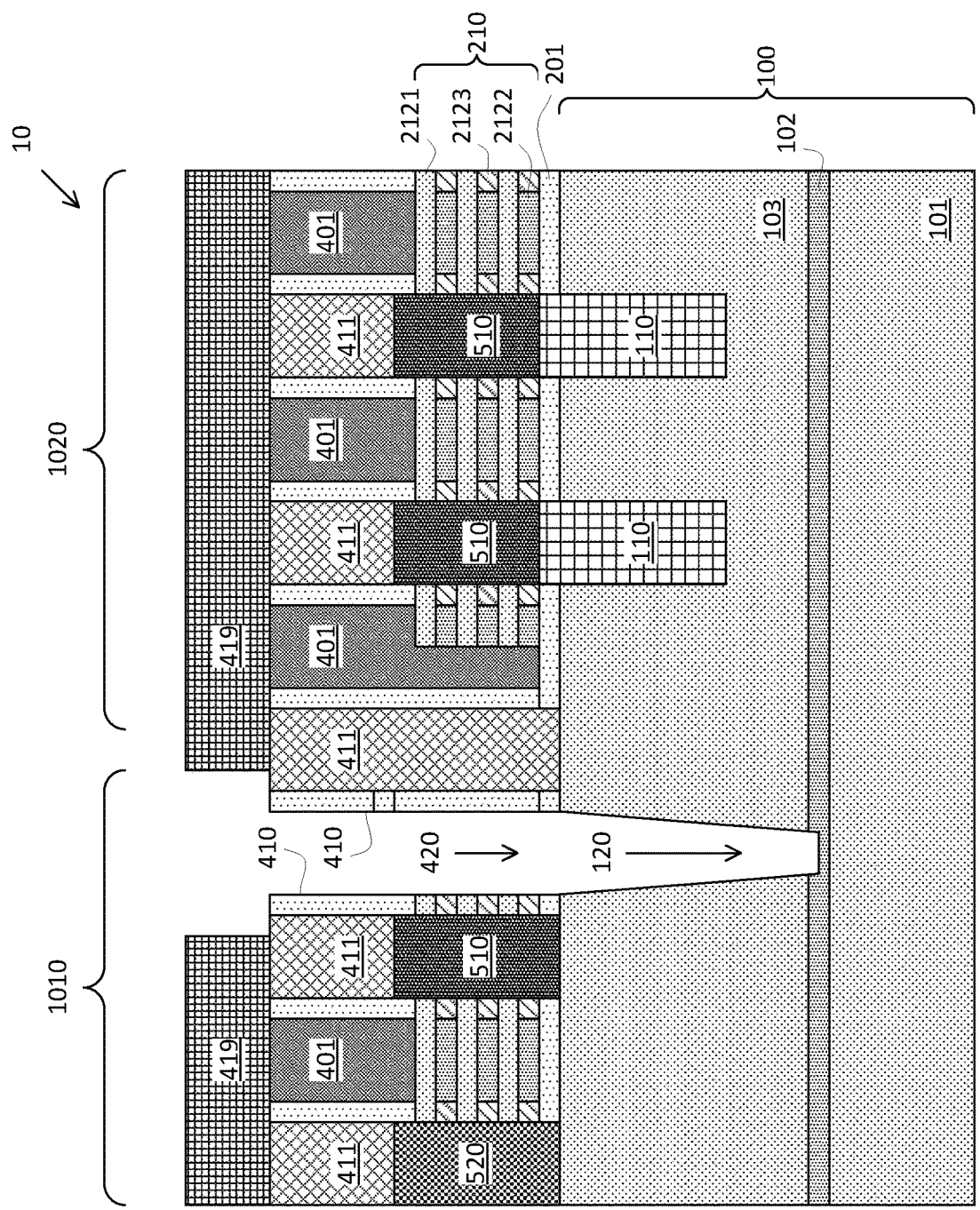

FIG. 4 is a demonstrative illustration of cross-sectional view of a semiconductor structure during a process of manufacturing thereof according to one embodiment of present invention. More particularly, following the step illustrated in FIG. 3, embodiments of present invention provide selectively etching the sacrificial gate structure exposed by the OPL 419 by removing the sacrificial gate 401, a portion of the stack of nanosheet 210 between the sidewall spacers 410, and the dielectric layer 201 to create an opening 420 that exposes the silicon layer 103 underneath the sacrificial gate 401. Embodiments of present invention provide further extending the opening 420 into the substrate 100 through a directional etching process to create an extended opening 120 below the opening 420 in the silicon layer 103 of the substrate 100. The extended opening 120 may expose the etch-stop layer 102 in the substrate 100.

Figure 5:
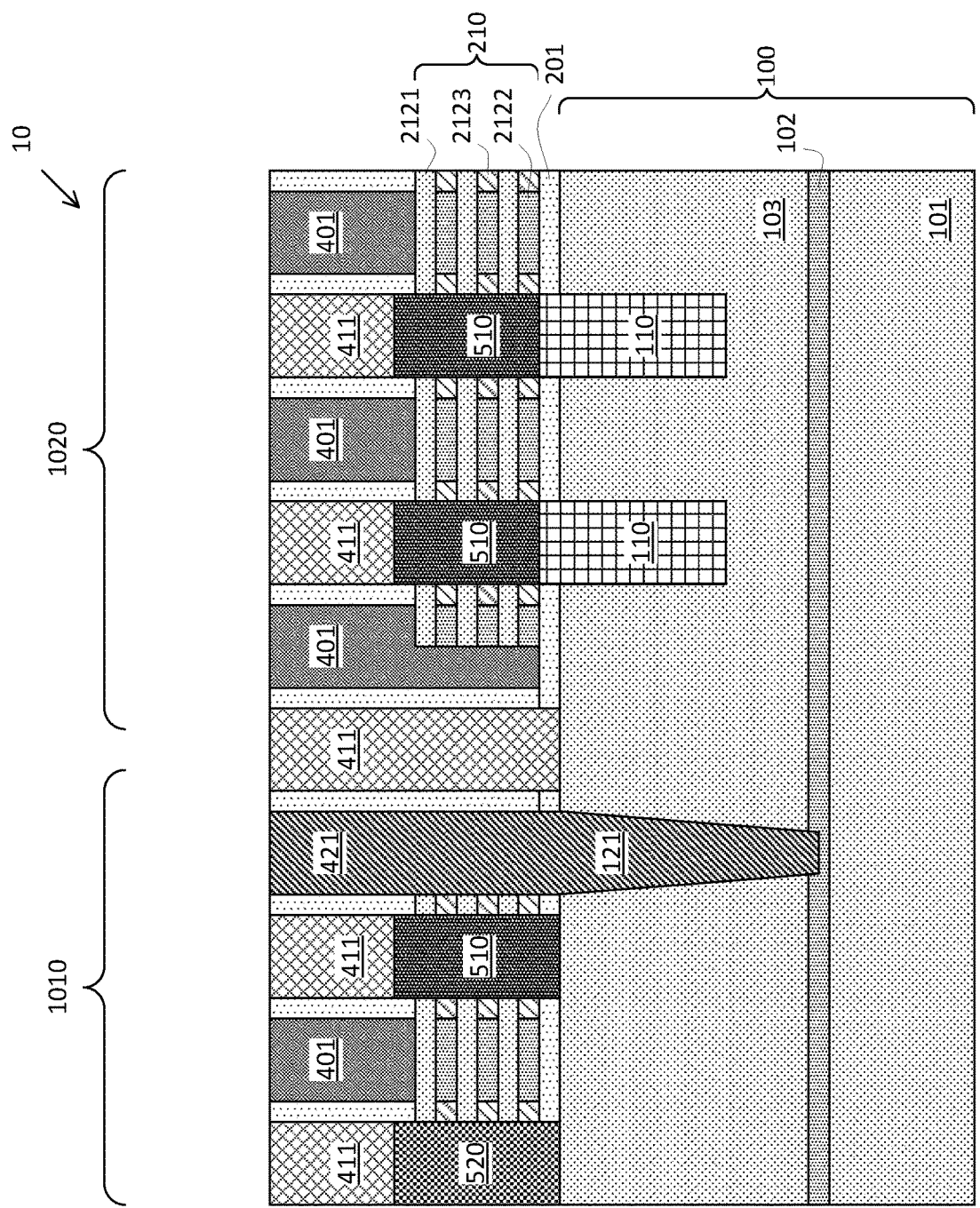

FIG. 5 is a demonstrative illustration of cross-sectional view of a semiconductor structure during a process of manufacturing thereof according to one embodiment of present invention. More particularly, following the step illustrated in FIG. 4, embodiments of present invention provide optionally removing the OPL 419 through an ash process, filling the opening 420 and the extended opening 120 with a dielectric material such as, for example silicon-nitride (SiN), to form a diffusion break 421 including a lower portion 121 of the diffusion break 421. A CMP process may then be applied to remove excessive dielectric material in the filling process to planarize a top surface of the diffusion break 421. Additionally, the OPL 419, if not being removed through an ash process, may be removed by the CMP process.

Figure 6:
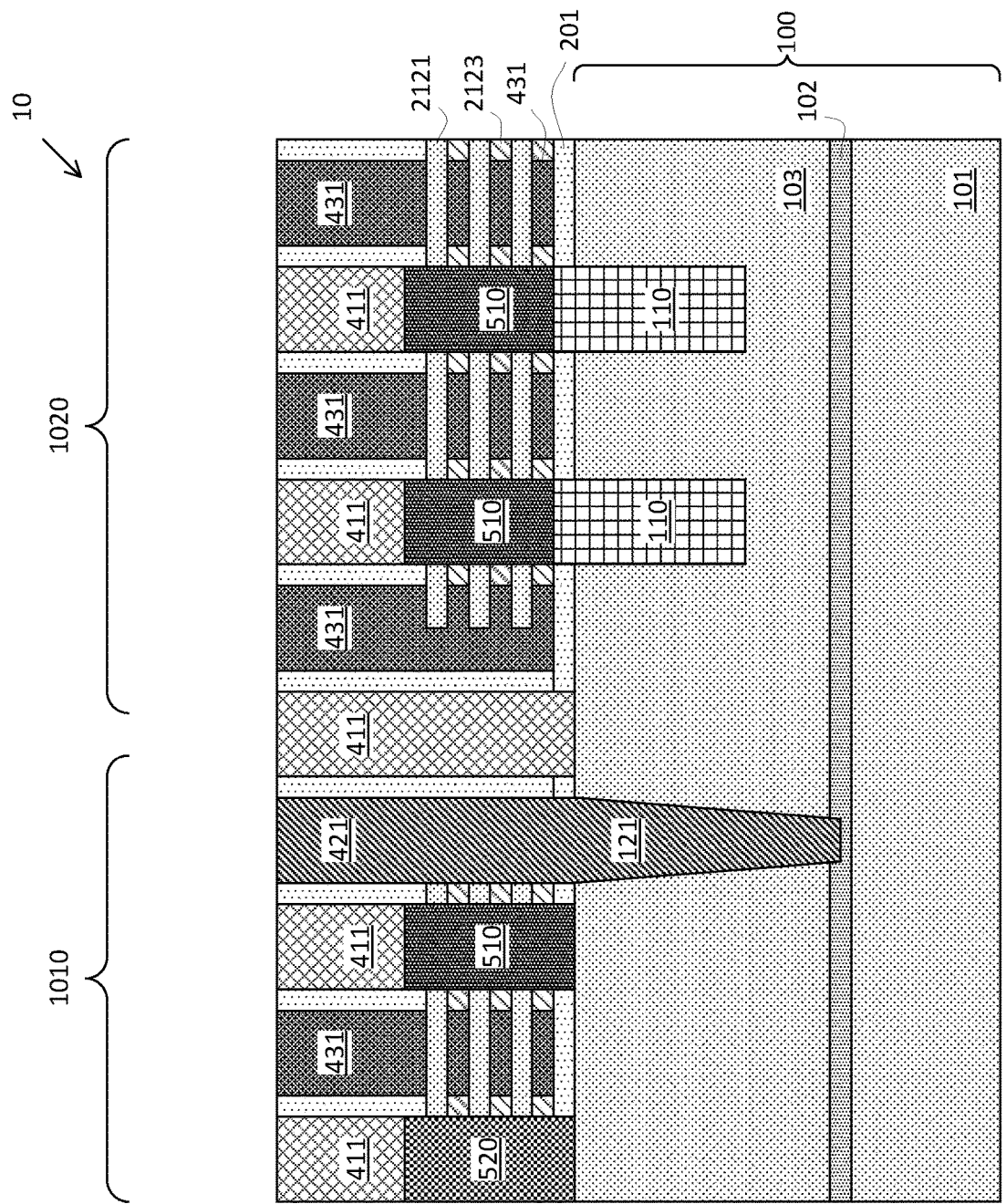

FIG. 6 is a demonstrative illustration of cross-sectional view of a semiconductor structure during a process of manufacturing thereof according to one embodiment of present invention. More particularly, following the step illustrated in FIG. 5, embodiments of present invention provide continuing to form the nanosheet transistors by removing the sacrificial gates 401; removing the sacrificial sheets 2122 between the set of nanosheets 2121; and filling the spaces or openings created by the removal of the sacrificial gates 401 and sacrificial sheets 2122, in a replacement metal gate (RMG) process, with a layer of gate dielectric, one or more work-function metals, and a conductive material of gate metal to form a set of metal gates 431.

Figure 7:
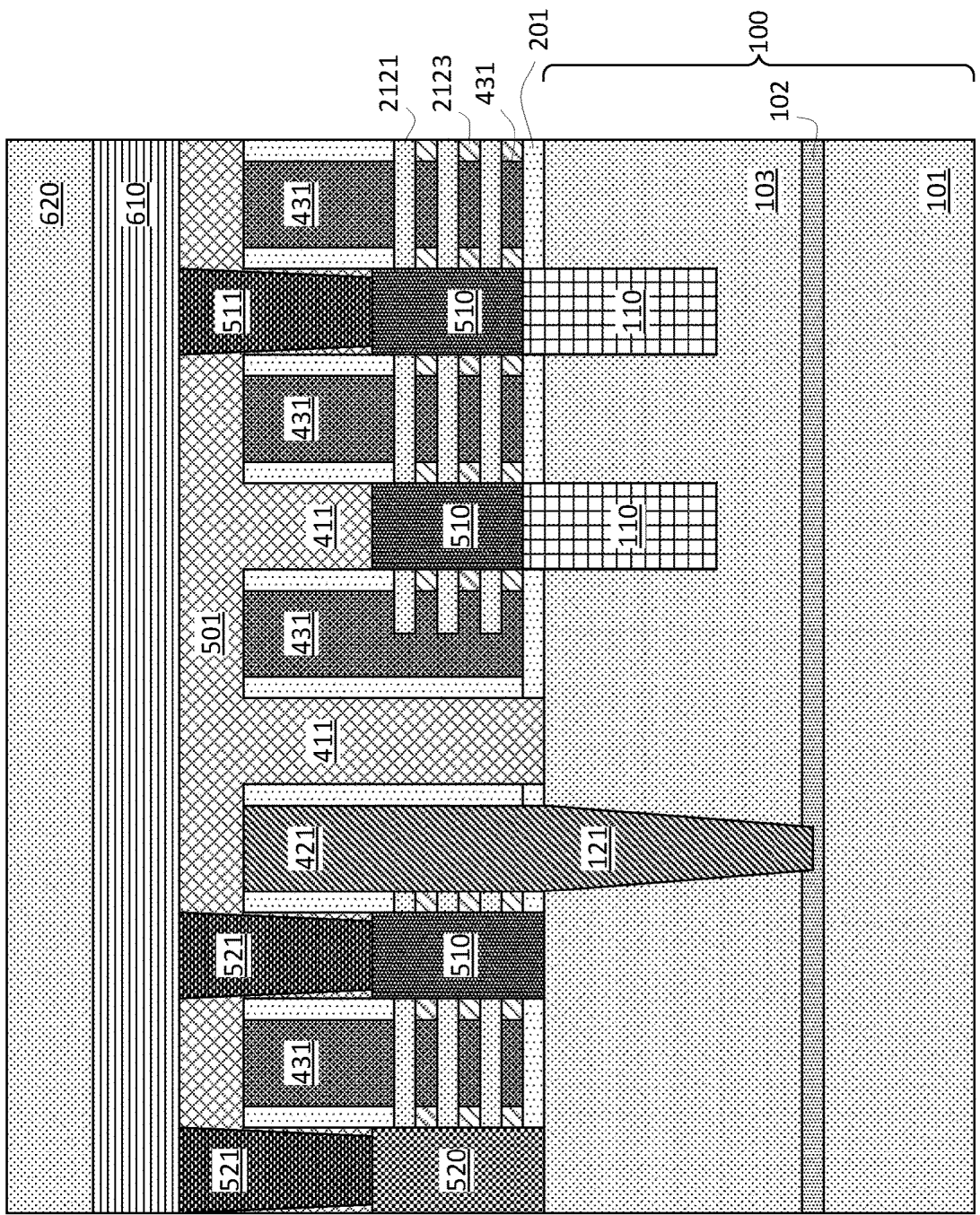

FIG. 7 is a demonstrative illustration of cross-sectional view of a semiconductor structure during a process of manufacturing thereof according to one embodiment of present invention. More particularly, following the step illustrated in FIG. 6, embodiments of present invention provide forming a dielectric layer 501 covering the set of metal gates 431; forming one or more source/drain contact 511, through the dielectric layers 501 and 411, in contact with the source/drain region 510; and forming one or more via contacts 521 in contact with the source/drain regions 510 and 520. The source/drain regions 510 and 520 in the passive device area 1010 may function as conductive paths for one or more passive devices and are therefore not formed to function as active source/drain regions of any active transistors. In one embodiment, the source/drain region 520 may be doped with a different type of dopant from that used in the source/drain region 510.

After forming the source/drain contact 511 and one or more via contacts 521, embodiments of present invention further provide forming a back-end-of-line (BEOL) structure 610 on top of the dielectric layer 501, the source/drain contact 511, and the via contacts 521. The BEOL structure 610 provides interconnect and/or routing for the active and/or passive devices underneath thereof. Next, a carrier wafer 620 may be attached, for example through bonding, to the BEOL structure 610 such that the semiconductor structure 10 may be flipped upside down for further processing from the backside of the semiconductor substrate 100.

It is to be noted here that upside-up (instead of upside-down) drawings will continue to be used hereinafter, for FIG. 8-FIG. 16, for ease of illustration. However, description of the drawings may be provided in a manner that is consistent with processing from the backside of the semiconductor substrate 100.

Figure 8:
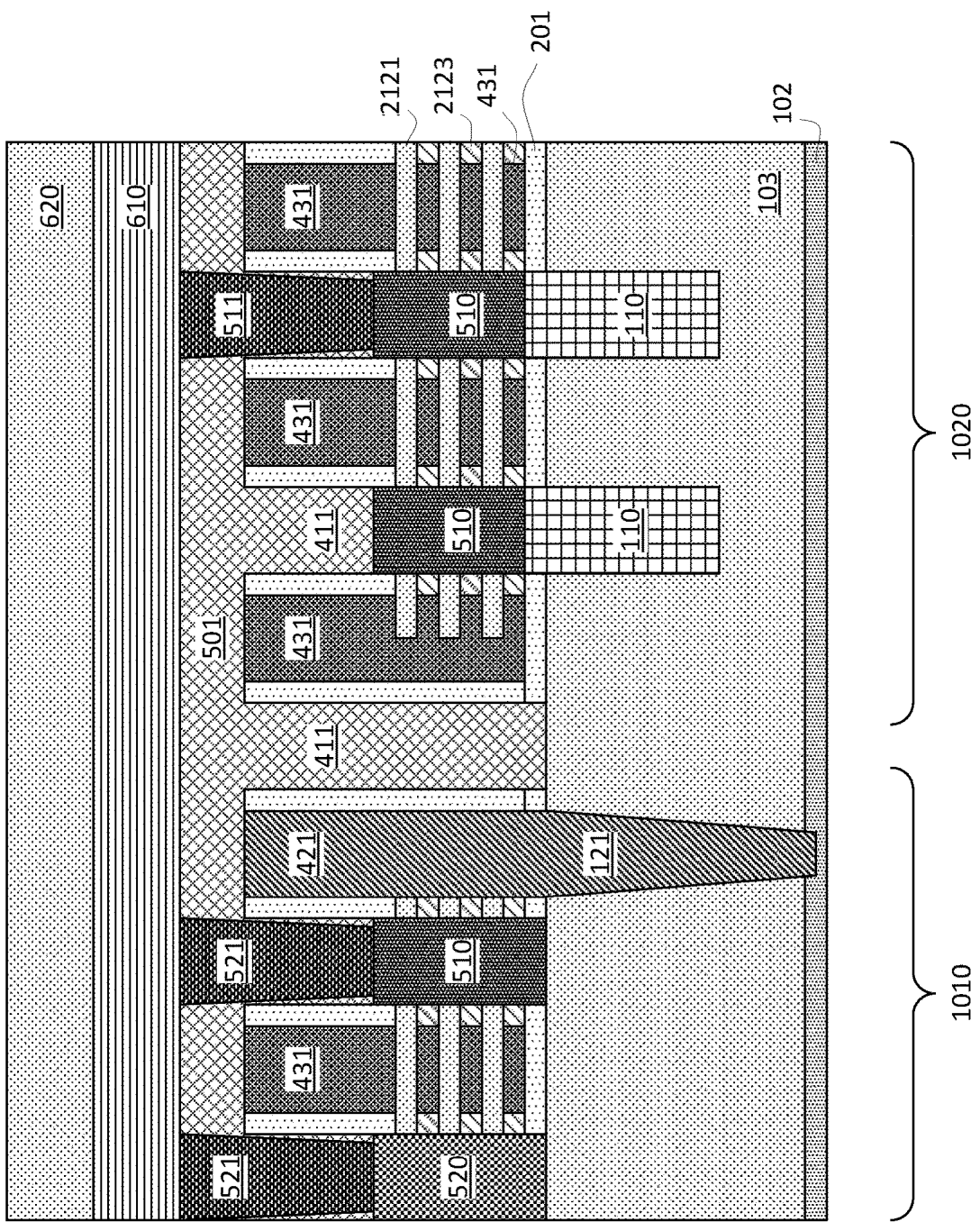

FIG. 8 is a demonstrative illustration of cross-sectional view of a semiconductor structure during a process of manufacturing thereof according to one embodiment of present invention. More particularly, following the step illustrated in FIG. 7, embodiments of present invention provide removing the Si substrate 101 through, for example, a CMP process, a grinding process, and/or in combination with other selective etching processes. The removal of the Si substrate 101 may stop at the etch-stop layer 102.

Figure 9:
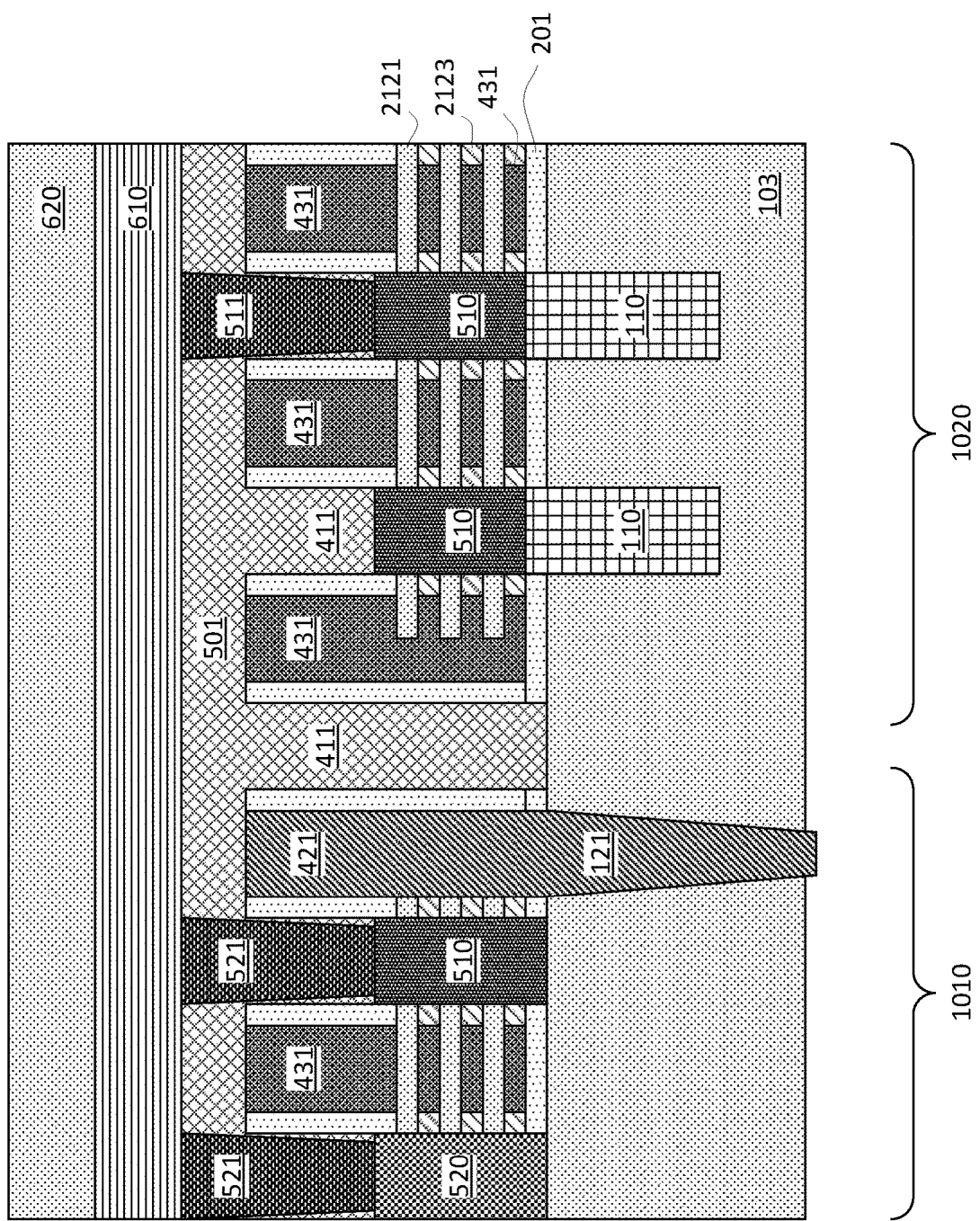

FIG. 9 is a demonstrative illustration of cross-sectional view of a semiconductor structure during a process of manufacturing thereof according to one embodiment of present invention. More particularly, following the step illustrated in FIG. 8, embodiments of present invention provide continuing to remove the etch-stop layer 102 by changing the etchant that is suitable for the etch-stop layer such as SiGe. The selective removal of the etch-stop layer 102 may expose the underneath silicon layer 103 and a portion of the lower portion 121 of the diffusion break 421. In one embodiment, the lower portion 121 of the diffusion break 421 may protrude the silicon layer 103.

Figure 10:
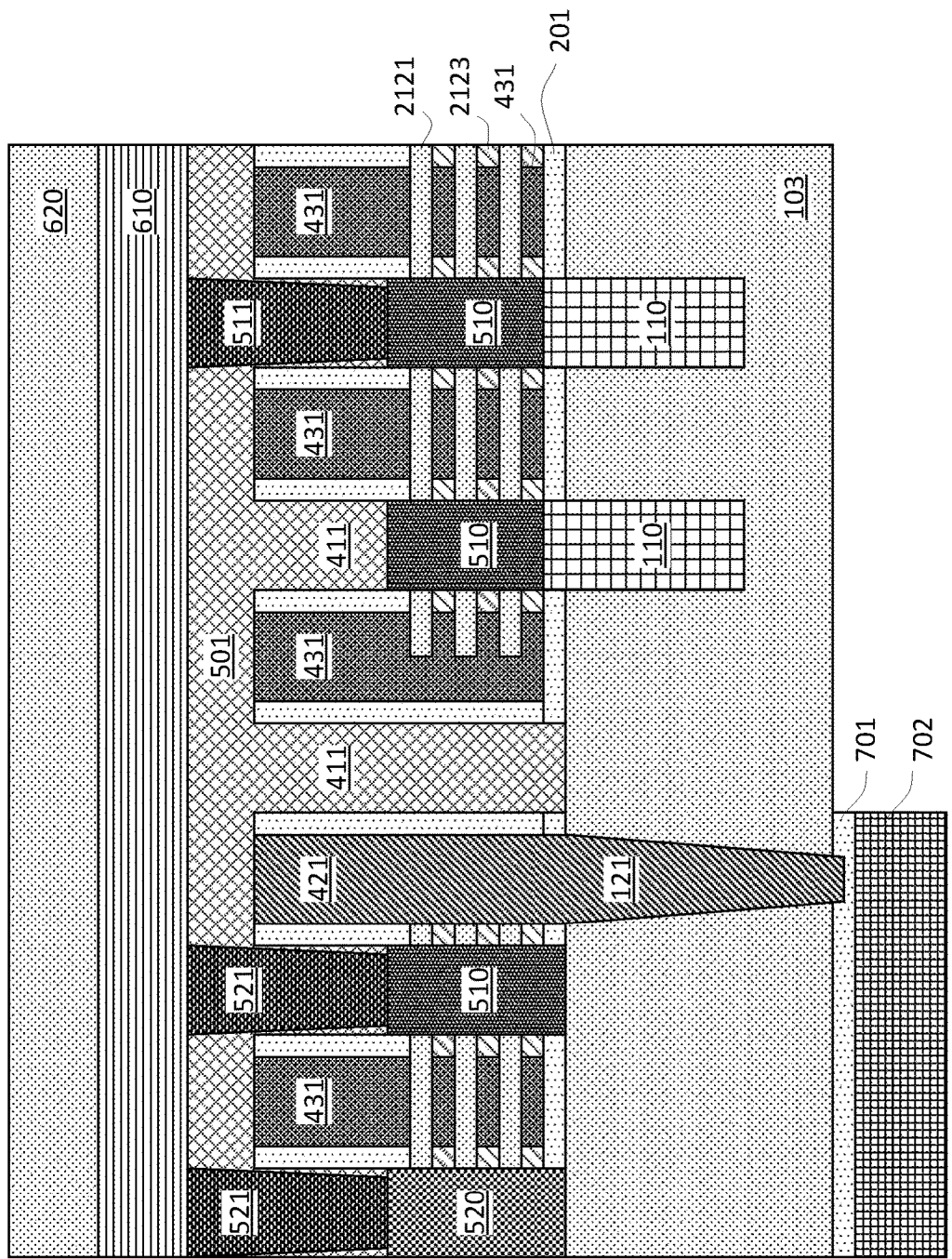

FIG. 10 is a demonstrative illustration of cross-sectional view of a semiconductor structure during a process of manufacturing thereof according to one embodiment of present invention. More particularly, following the step illustrated in FIG. 9, embodiments of present invention provide proceeding to remove a portion of the substrate 100 under the logic device area 1020. In doing so, embodiments of present invention provide covering a portion of the substrate 100 under the passive device area 1010 with a hard mask 701. The hard mask 701 may be formed by first forming a hard mask material layer on top of the silicon layer 103 and on top of the lower portion 121 of the diffusion break 421. An OPL 702 may be formed and patterned on top of the hard mask material layer. The pattern of the OPL 702 may then be transferred onto the hard mask material layer through a selective etching process to form the hard mask 701. Here it is noted that the diffusion break 421 including its lower portion 121 are covered by the hard mask 701.

Figure 11:
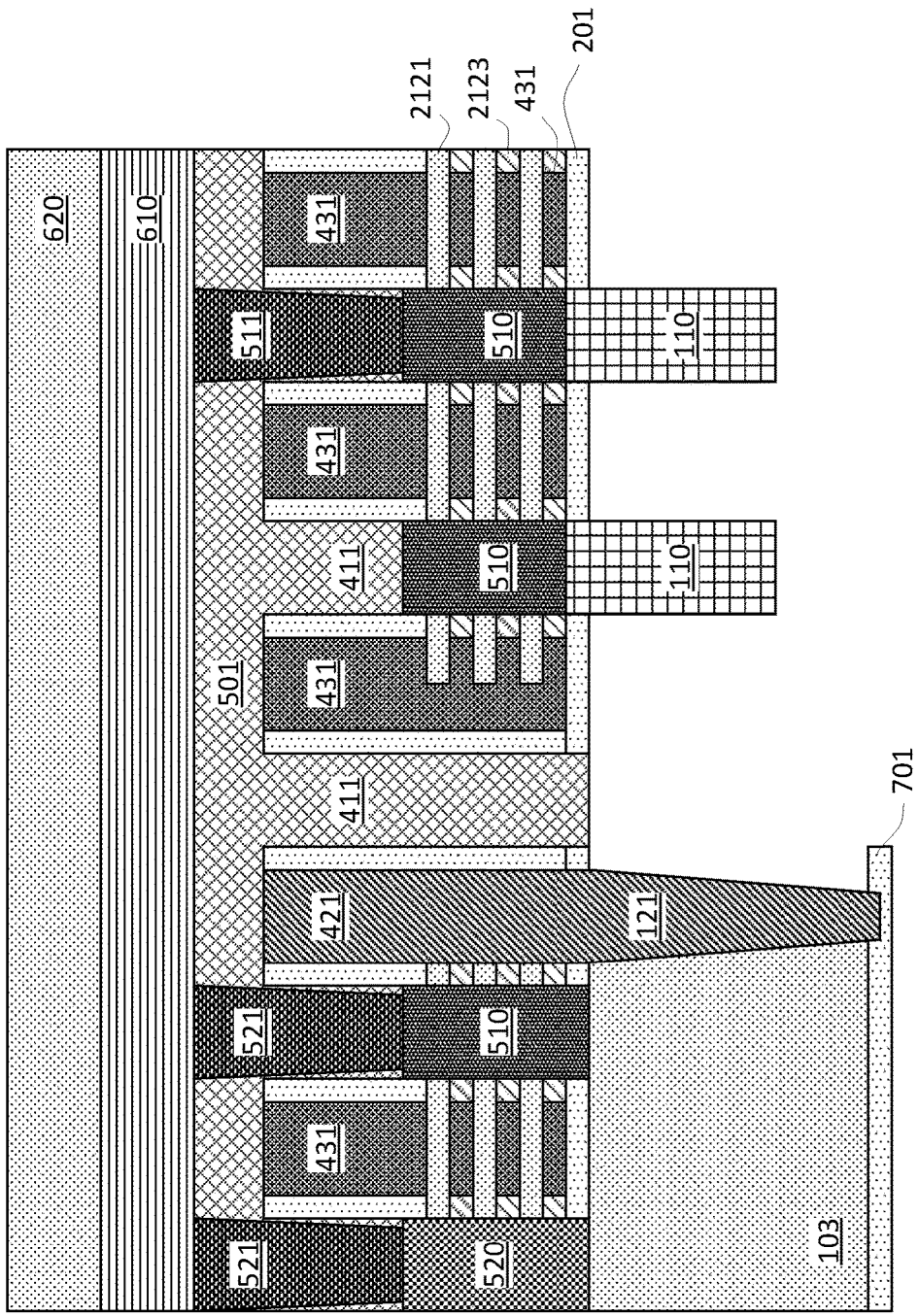

FIG. 11 is a demonstrative illustration of cross-sectional view of a semiconductor structure during a process of manufacturing thereof according to one embodiment of present invention. More particularly, following the step illustrated in FIG. 10, embodiments of present invention provide removing the portion of silicon layer 103 underneath the logic device area 1020 in a selective etching process while the portion of silicon layer 103 underneath the passive device area 1010 is covered and protected by the hard mask 701. The selective etching process in removing the portion of silicon layer 103 may be selective to the placeholders 110 by applying etch selectivity in materials between the silicon layer 103 and the placeholders 110 which, as is described above, may be SiGe. During the selective etching process to remove the portion of silicon layer 103 under the logic device area 1020, the lower portion 121 of the diffusion break 421 protects the sidewall of the portion of silicon layer 103 under the passive device area 1010, thereby preventing undercut of the silicon layer 103 through areas underneath the hard mask 701.

Figure 12:
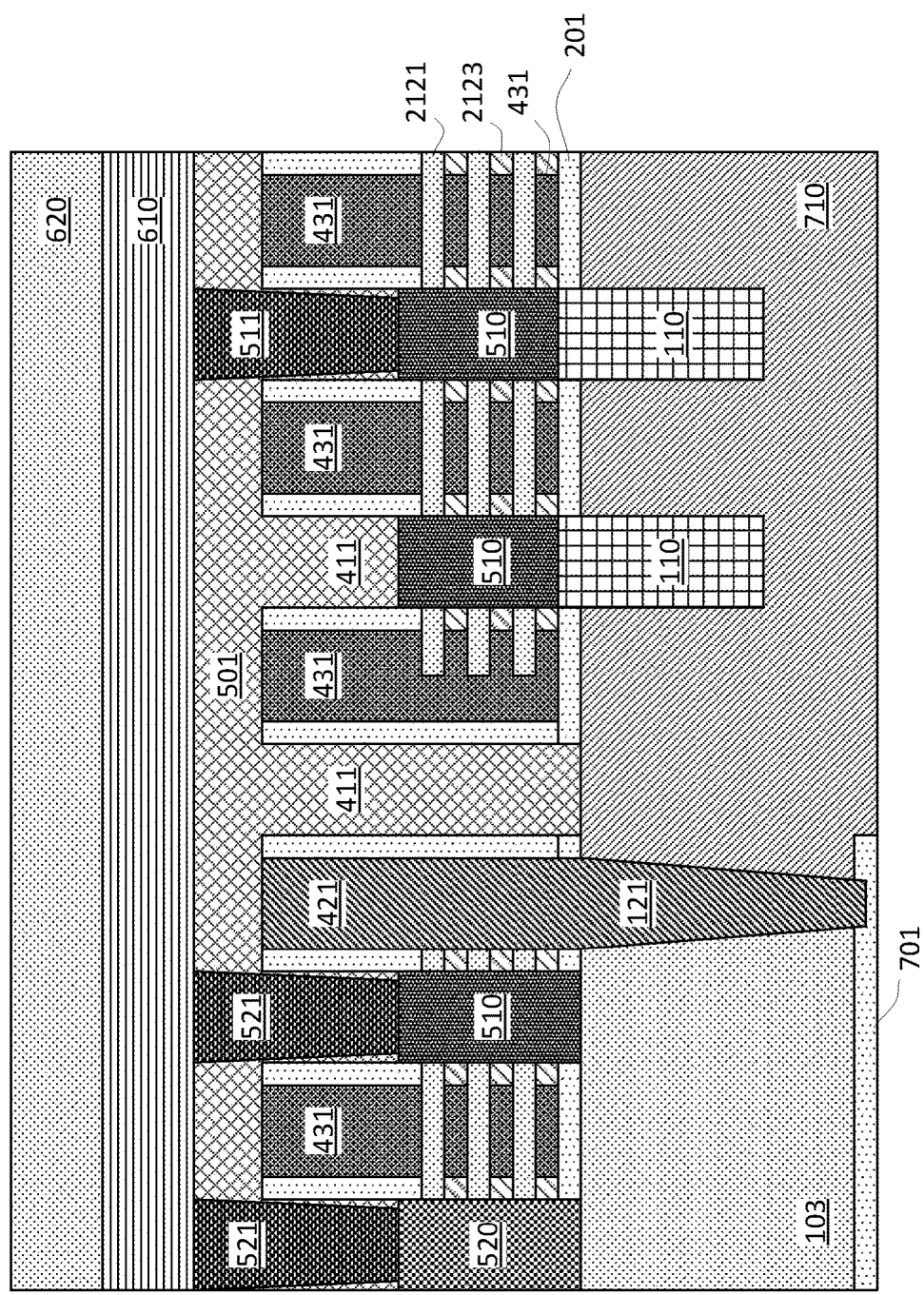

FIG. 12 is a demonstrative illustration of cross-sectional view of a semiconductor structure during a process of manufacturing thereof according to one embodiment of present invention. More particularly, following the step illustrated in FIG. 11, embodiments of present invention provide removing the OPL 702 through an ash process and depositing a layer of dielectric material to cover the backside of the logic device area 1020 and the exposed placeholders 110 that are directly underneath some source/drain regions 510 in the logic device area 1020, thereby forming a backside interlevel dielectric (BILD) layer 710. A CMP process may subsequently be applied to planarize a top surface of the BILD layer 710 such that it becomes coplanar with the hard mask 701.

Figure 13:
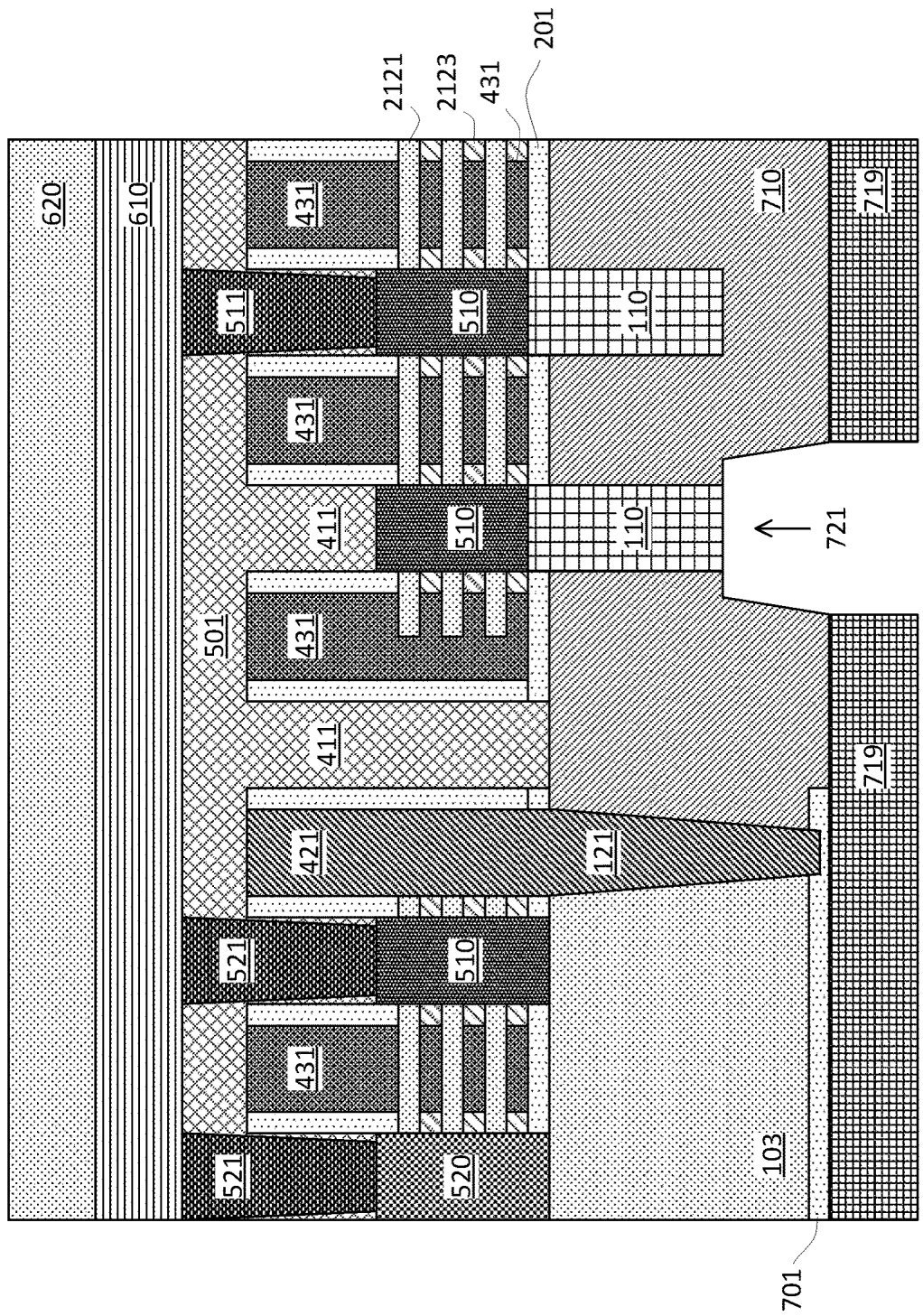

FIG. 13 is a demonstrative illustration of cross-sectional view of a semiconductor structure during a process of manufacturing thereof according to one embodiment of present invention. More particularly, following the step illustrated in FIG. 12, embodiments of present invention provide forming an OPL 719 on top of the BILD layer 710; patterning the OPL 719; and transferring the pattern of the OPL 719 into the BILD layer 710 to create an opening 721. The opening 721 may be substantially aligned with one of the placeholders 110, thereby exposing the placeholder 110.

Figure 14:
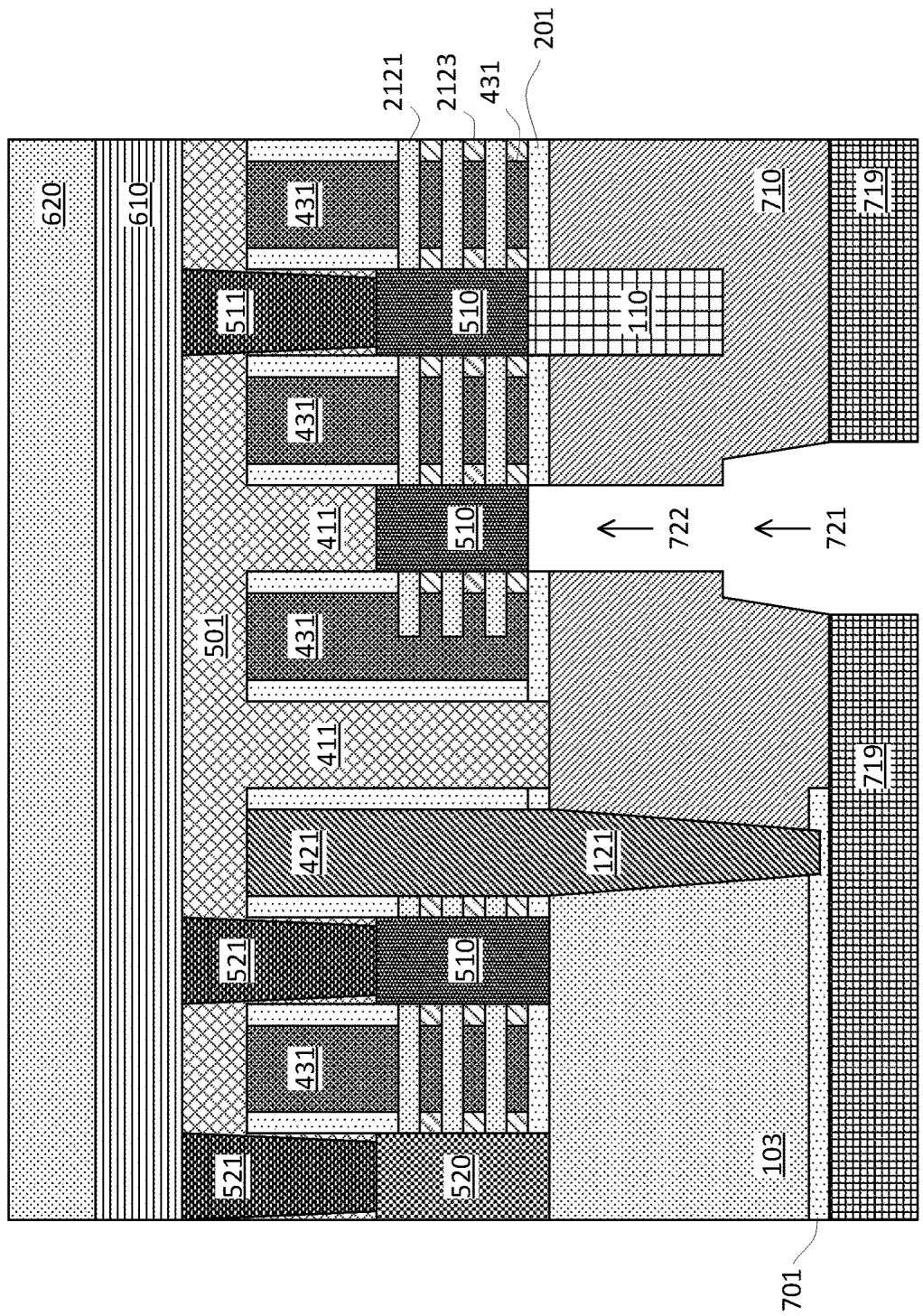

FIG. 14 is a demonstrative illustration of cross-sectional view of a semiconductor structure during a process of manufacturing thereof according to one embodiment of present invention. More particularly, following the step illustrated in FIG. 13, embodiments of present invention provide selectively removing the placeholder 110 to create an opening 722 below the opening 721. The opening 722 exposes a bottom surface of one of the source/drain region 510 of a nanosheet transistor.

Figure 15:
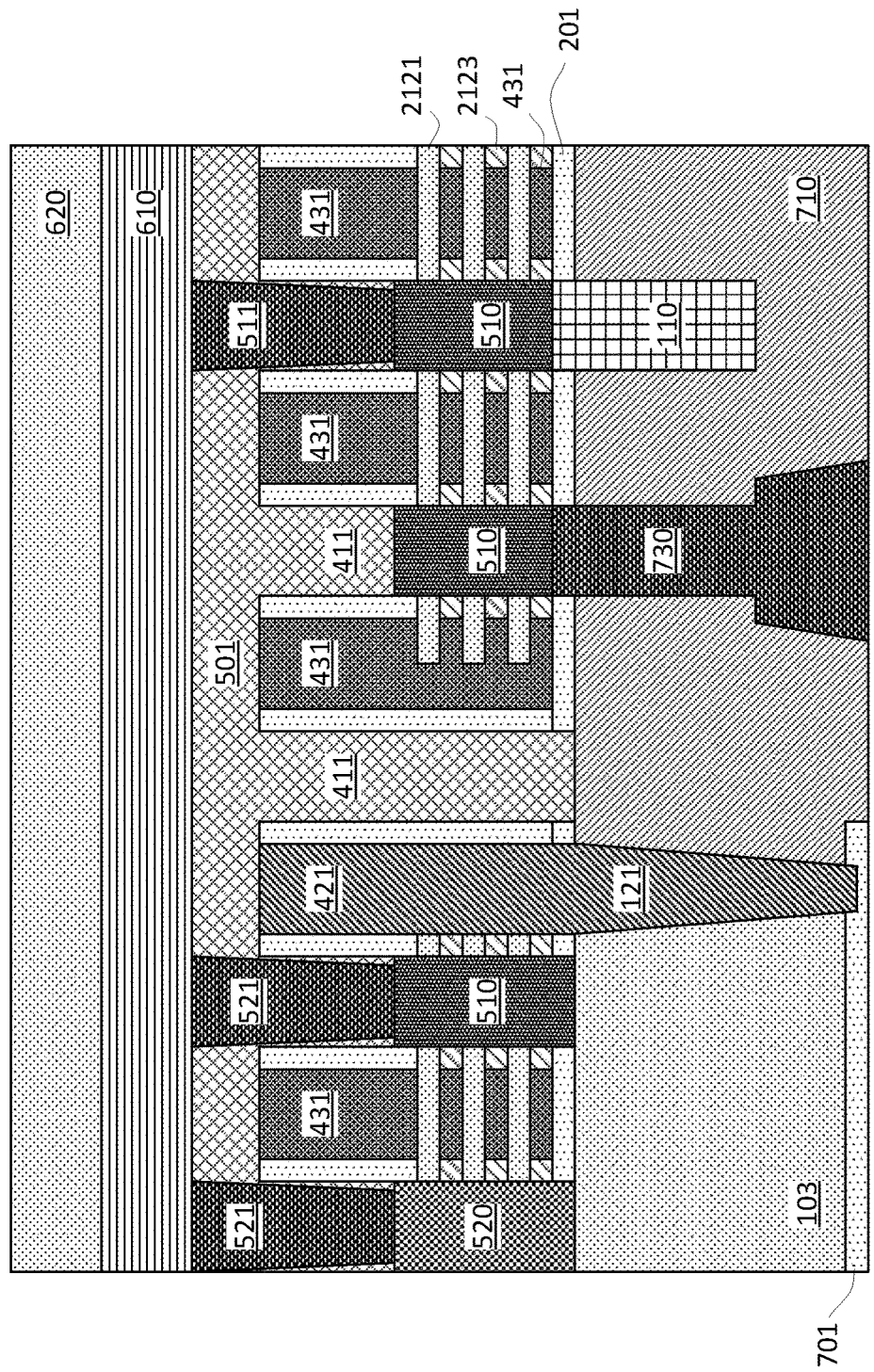

FIG. 15 is a demonstrative illustration of cross-sectional view of a semiconductor structure during a process of manufacturing thereof according to one embodiment of present invention. More particularly, following the step illustrated in FIG. 16, embodiments of present invention provide filling the openings 721 and 722 with a conductive material to for a backside contact 730 that contacts the source/drain region 510. After filling the openings 721 and 722, a CMP process may be applied to planarize a top surface of the backside contact 730 such that it may become coplanar with the BILD layer 710 and/or the hard mask 701.

Figure 16:
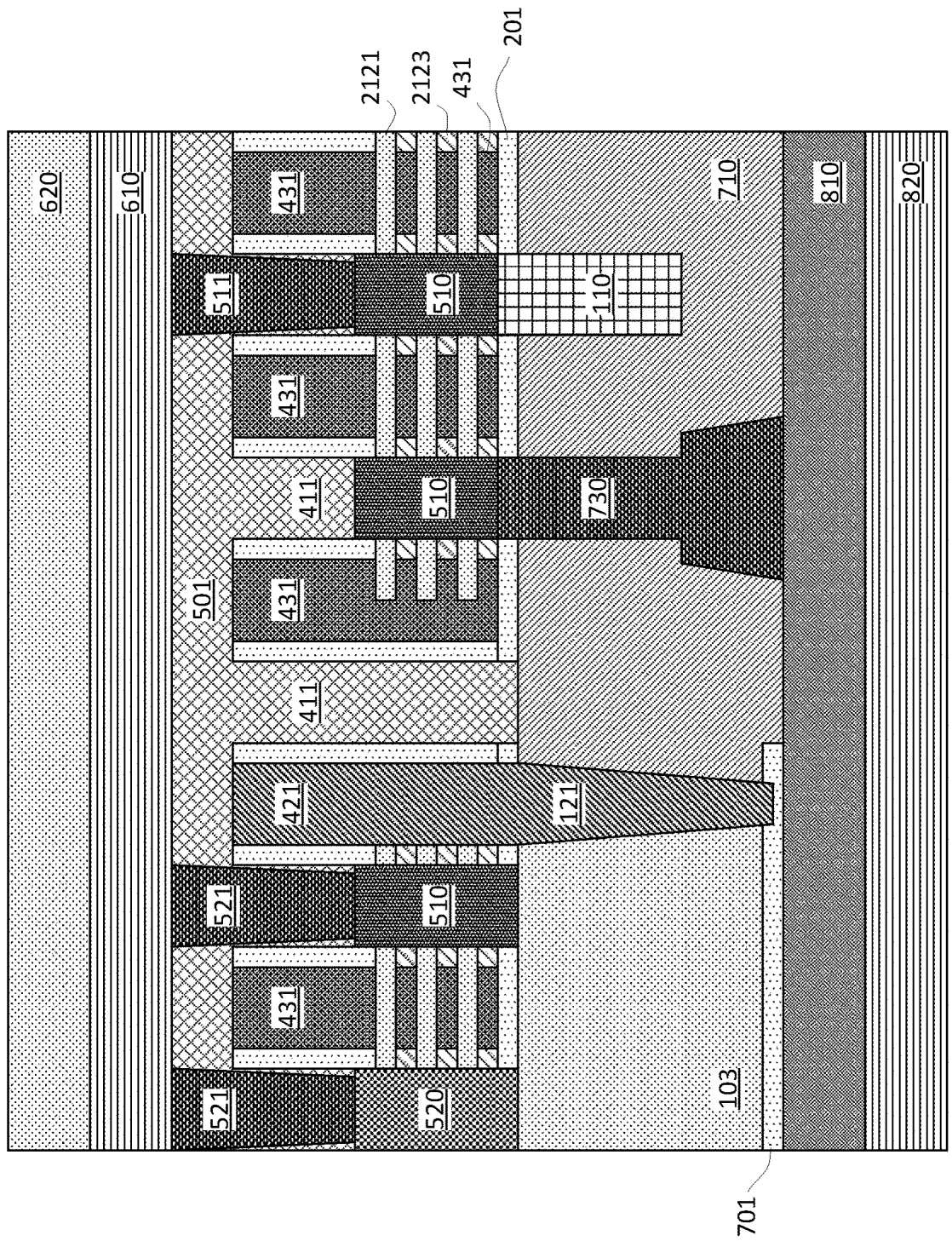

FIG. 16 is a demonstrative illustration of cross-sectional view of a semiconductor structure during a process of manufacturing thereof according to one embodiment of present invention. More particularly, following the step illustrated in FIG. 15, embodiments of present invention provide forming a backside power rail (BSPR) layer 810 in contact with the backside contact 730, and subsequently a backside power distribution network (BSPDN) 820 on top of the BSPR 810.

As being discussed above, embodiments of present invention provide a diffusion break 421, and a method of forming the diffusion break 421, such that the passive device area 1010 may be formed next to the logic device area 1020, with just one CPP distance separating the passive device area 1010 from the logic device area 1020.

Figure 17:
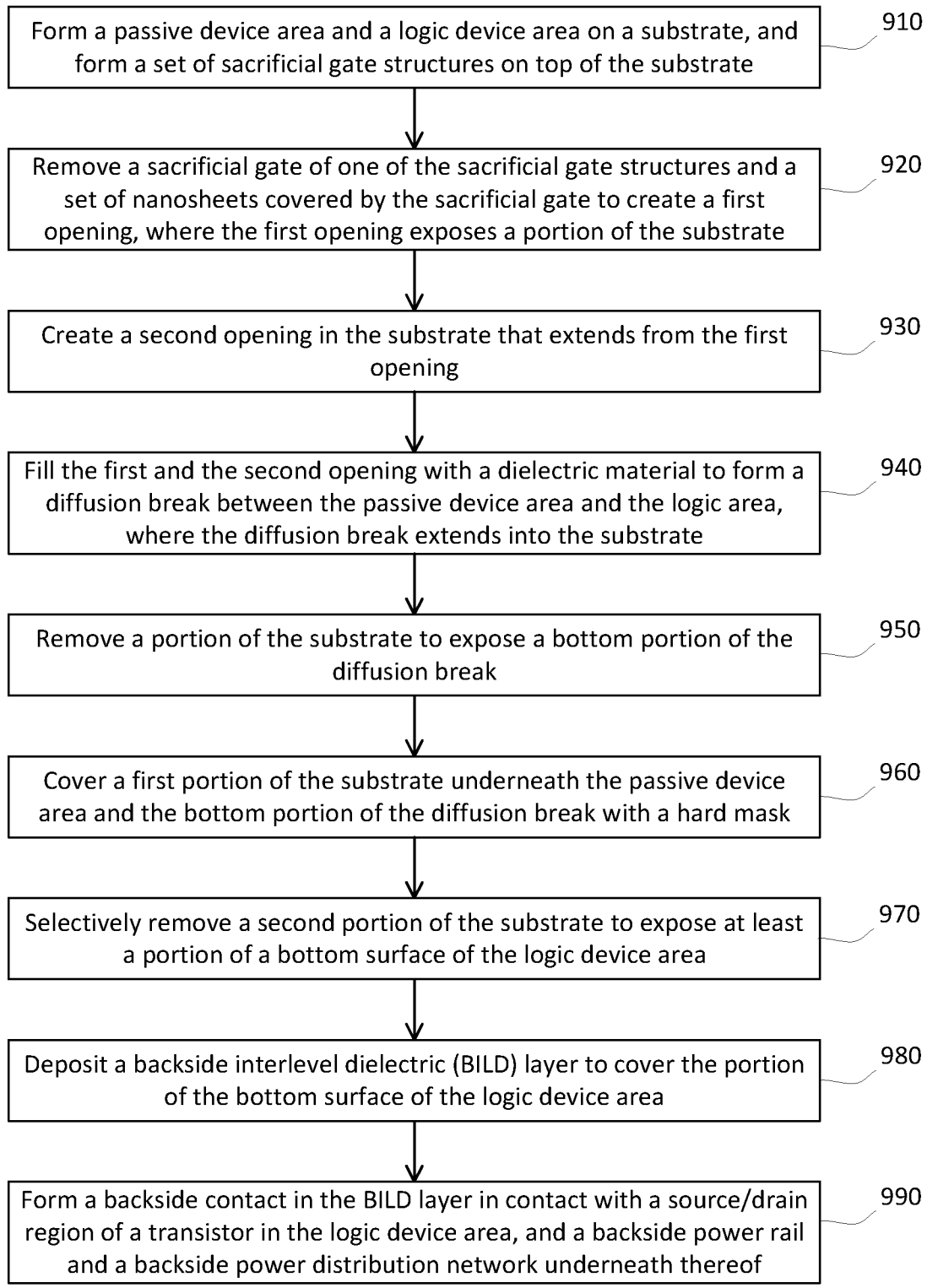
FIG. 17 is a demonstrative illustration of a flow-chart of a method of manufacturing a semiconductor structure according to embodiments of present invention.

FIG. 17 is a demonstrative illustration of a flow-chart of a method of manufacturing a semiconductor structure according to embodiments of present invention. The method includes (910) forming a passive device area and a logic device area on a substrate, and forming a set of sacrificial gate structure on top of the substrate; (920) removing a sacrificial gate of one of the sacrificial gate structures and a set of nanosheets covered by the sacrificial gate to create a first opening, where the first opening exposes a portion of the substrate; (930) creating a second opening in the substrate that extends from the first opening; (940) filling the first and the second opening with a dielectric material to form a diffusion break between the passive device area and the logic device area, where the diffusion break extends into the substrate; (950) removing a portion of the substrate to expose a bottom portion of the diffusion break; (960) covering a first portion of the substrate underneath the passive device area and the bottom portion of the diffusion break with a hard mask; (970) selectively removing a second portion of the substrate to expose at least a portion of a bottom surface of the logic device area; (980) depositing a backside interlevel dielectric layer to cover the portion of the bottom surface of the logic device area; and (990) forming a backside contact in the backside interlevel dielectric layer in contact with a source/drain region of a transistor in the logic device area, and forming a backside power rail and a backside power distribution network underneath both the passive device area and the logic device area.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
   a passive device area adjacent to a logic device area;
   a diffusion break between the passive device area and the logic device area,
   wherein the diffusion break extends below the passive device area and the logic device area to separate a doped silicon substrate underneath the passive device area from a backside interlevel dielectric (BILD) layer underneath the logic device area.

2. The semiconductor structure of claim 1, further comprising a hard mask covering a bottom surface of the doped silicon substrate, wherein the diffusion break extends into the hard mask to be in contact with the hard mask.

3. The semiconductor structure of claim 2, further comprising a backside power rail (BSPR) directly underneath the doped silicon substrate below the passive device area and the BILD layer below the logic device area, wherein the hard mask separates vertically the doped silicon substrate from the BSPR.

4. The semiconductor structure of claim 3, wherein a source/drain region of a transistor in the logic device area is connected to the BSPR through a backside contact formed in the BILD layer.

5. The semiconductor structure of claim 1, wherein the diffusion break is a single diffusion break formed through a gate region of a dummy gate.

6. The semiconductor structure of claim 1, wherein a first sidewall of a lower portion of the diffusion break is in direct contact with the doped silicon substrate and a second sidewall of the lower portion of the diffusion break is in direct contact with the BILD layer.

7. The semiconductor structure of claim 1, wherein the passive device area and the logic device area are separated by a dielectric layer, the dielectric layer being formed directly on top of the BILD layer.

8. A method of forming a semiconductor structure comprising:
   forming a passive device area and a logic device area on a substrate;
   forming a diffusion break between the passive device area and the logic device area, wherein the diffusion break extends into the substrate;
   removing a portion of the substrate to expose a bottom portion of the diffusion break;
   covering a first portion of the substrate underneath the passive device area and the bottom portion of the diffusion break with a hard mask;
   selectively removing a second portion of the substrate to expose at least a portion of a bottom surface of the logic device area; and
   depositing a backside interlevel dielectric (BILD) layer to cover the portion of the bottom surface of the logic device area.

9. The method of claim 8, wherein forming the diffusion break comprises:
   forming a set of sacrificial gate structures on top of the substrate;
   removing a sacrificial gate of one of the sacrificial gate structures and a set of nanosheets covered by the sacrificial gate to create a first opening, wherein the first opening exposes the substrate;
   creating a second opening in the substrate that extends from the first opening; and
   filling the first and the second opening with a dielectric material to form the diffusion break.

10. The method of claim 9, wherein creating the second opening comprises etching the exposed portion of the substrate until an etch-stop layer in the substrate is exposed.

11. The method of claim 8, further comprising forming a backside contact in the BILD layer by creating an opening in the BILD layer to expose a placeholder and replacing the placeholder with a conductive material to form the backside contact, the backside contact being in contact with a source/drain region of a transistor in the logic device area.

12. The method of claim 11, further comprising forming a backside power rail (BSPR) in contact with the backside contact in the BILD layer, wherein the hard mask separates the first portion of the substrate underneath the passive device area from the BSPR.

13. The method of claim 9, further comprising, after forming the diffusion break, conducing a replacement metal gate (RMG) process to form a set of metal gate replacing the set of sacrificial gate structures.

14. A semiconductor structure comprising:
   a passive device area on top of a silicon substrate;
   a logic device area on top of a backside interlevel dielectric (BILD) layer; and
   a diffusion break between the silicon substrate and the BILD layer separating the passive device area from the logic device area.

15. The semiconductor structure of claim 14, further comprising a hard mask covering a bottom surface of the silicon substrate and being in contact with the diffusion break, the hard mask being coplanar with the BILD layer.

16. The semiconductor structure of claim 15, further comprising a backside power rail (BSPR) directly underneath the hard mask and the BILD layer, and a backside power distribution network (BSPDN) underneath the BSPR.

17. The semiconductor structure of claim 16, wherein a source/drain region of a nanosheet transistor in the logic device area is connected to the BSPR through a backside contact formed in the BILD layer.

18. The semiconductor structure of claim 14, wherein the diffusion break is a single diffusion break formed through a gate region of a sacrificial gate structure.

19. The semiconductor structure of claim 14, wherein a lower portion of the diffusion break is in direct contact with the silicon substrate and the BILD layer.

20. The semiconductor structure of claim 14, wherein the passive device area and the logic device area are further separated by a dielectric layer, the dielectric layer being directly above the BILD layer.

* * * * *